(12) United States Patent
Tailliet et al.

(10) Patent No.: US 10,049,753 B2
(45) Date of Patent: Aug. 14, 2018

(54) RECONFIGURABLE SENSE AMPLIFIER

(71) Applicant: STMicroelectronics (Rousset) SAS, Rousset (FR)

(72) Inventors: François Tailliet, Fuveau (FR); Victorien Brecte, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/657,492

(22) Filed: Jul. 24, 2017

(65) Prior Publication Data

US 2017/0323683 A1 Nov. 9, 2017

Related U.S. Application Data

(63) Continuation of application No. 15/141,084, filed on Apr. 28, 2016, now Pat. No. 9,761,316.

(30) Foreign Application Priority Data

Dec. 1, 2015 (FR) ...................................... 15 61649

(51) Int. Cl.
*G11C 16/26* (2006.01)
*G11C 16/08* (2006.01)

(52) U.S. Cl.
CPC .............. *G11C 16/26* (2013.01); *G11C 16/08* (2013.01)

(58) Field of Classification Search
CPC ................................ G11C 16/26; G11C 16/08
USPC .................................................... 365/185.11
See application file for complete search history.

(56) References Cited

U.S. PATENT DOCUMENTS

| | | | |
|---|---|---|---|
| 5,247,213 A | 9/1993 | Trinh et al. | |
| 5,822,262 A | 10/1998 | Hashimoto et al. | |
| 5,835,394 A * | 11/1998 | Wong ...................... | G06F 7/544 708/670 |
| 6,424,577 B2 | 7/2002 | Sim | |
| 7,031,212 B2 * | 4/2006 | La Rosa ................ | G11C 7/067 365/185.21 |
| 7,212,459 B2 | 5/2007 | Tran et al. | |
| 8,437,196 B2 | 5/2013 | Lo Giudice et al. | |
| 8,750,047 B2 | 6/2014 | Perroni | |
| 2003/0025532 A1 | 2/2003 | Telecco | |
| 2004/0179418 A1 | 9/2004 | Hwang | |
| 2006/0256619 A1 | 11/2006 | Daga et al. | |
| 2010/0110791 A1 * | 5/2010 | Tailliet ............... | G11C 16/0425 365/185.09 |
| 2013/0069623 A1 | 3/2013 | Fort | |
| 2013/0148453 A1 * | 6/2013 | John ..................... | G11C 7/065 365/210.1 |

(Continued)

FOREIGN PATENT DOCUMENTS

WO 2012102785 A2 8/2012

*Primary Examiner* — Son Mai
*Assistant Examiner* — Muna A Techane
(74) *Attorney, Agent, or Firm* — Slater Matsil, LLP

(57) ABSTRACT

A memory sense amplifier is configurable on command between a current-sensing mode and a voltage-sensing mode. The sense amplifier is intended, in its current-sensing configuration, to read a datum stored in a memory cell connected to the amplifier, and is intended, in its voltage-sensing configuration, to read a datum stored in a bit-line latch connected to the amplifier.

24 Claims, 3 Drawing Sheets

(56) References Cited

U.S. PATENT DOCUMENTS

2015/0008987 A1* 1/2015 Bollapalli ............ H03K 3/0315
331/108 C
2015/0170726 A1* 6/2015 Antonyan ........... G11C 11/1673
365/158

* cited by examiner

RECONFIGURABLE SENSE AMPLIFIER

CROSS-REFERENCE TO RELATED APPLICATIONS

This application is a continuation of U.S. patent application Ser. No. 15/141,084, filed on Apr. 28, 2016, which claims priority to French Patent Application No. 1561649, filed on Dec. 1, 2015, which applications are hereby incorporated herein by reference.

TECHNICAL FIELD

The present invention relates to memories, in particular non-volatile memories, for example electrically erasable programmable memories (EEPROMs) or flash memories, and more particularly to the sense amplifiers associated with these memories.

BACKGROUND

Non-volatile memory is memory that can retrieve stored information even after having been power cycled (turned off and back on). Examples of non-volatile memory include electrically erasable programmable memories (EEPROMs) and flash memories. Sense amplifiers are used to read information from the cells of memories.

SUMMARY

A memory sense amplifier is configurable on command between a current-sensing mode and a voltage-sensing mode.

In one embodiment the sense amplifier is able in its current-sensing configuration to deliver as output an information item representative of whether or not a current is flowing through an input of the amplifier, and is able in its voltage-sensing configuration to deliver as output an information item representative of whether or not the voltage present on this input has dropped.

In one embodiment the sense amplifier is intended, in its current-sensing configuration, to read a datum stored in a memory cell connected to the amplifier, and intended, in its voltage-sensing configuration, to read a datum stored in a bit-line latch connected to the amplifier.

In one embodiment, the input is intended to be effectively connected to the bit line connected to the memory cell in its current-sensing configuration and to be effectively connected to the bit-line latch in its voltage-sensing configuration.

In one embodiment the sense amplifier comprises a configurable input stage connected between the input and an intermediate node and able to deliver to the intermediate node an intermediate signal the voltage level of which is, depending on the configuration, representative of whether or not the current is flowing through the input or whether or not the voltage present on the input has dropped, and an output stage configured to deliver the information item on the basis of the intermediate signal.

In one embodiment, the input stage comprises a precharge loop configured to apply a precharge voltage to the input and a configurable controller connected between the precharge loop and the intermediate node, possessing a first configuration in which it allows maintenance of the precharge voltage on the input in the current-sensing configuration, and a second configuration in which it permits a possible drop in the voltage on the input in the voltage-sensing configuration.

In one embodiment, the controller includes an n-type transistor, the gate of which is connected to the intermediate node, the source of which is connected to the precharge loop, and the drain of which is connected to the drain of a p-type transistor controlled via its gate by a command signal defining the sensing configuration and having its source connected to a supply voltage.

In one embodiment, the output stage is configured to translate the intermediate signal into a binary logic signal, and includes an inverter configured to invert the logic signal in the voltage-sensing configuration.

BRIEF DESCRIPTION OF THE DRAWINGS

Other advantages and features of the invention will become apparent on examining the detailed description of completely non-limiting embodiments, and the appended drawings, in which.

DETAILED DESCRIPTION OF ILLUSTRATIVE EMBODIMENTS

Figure 1:
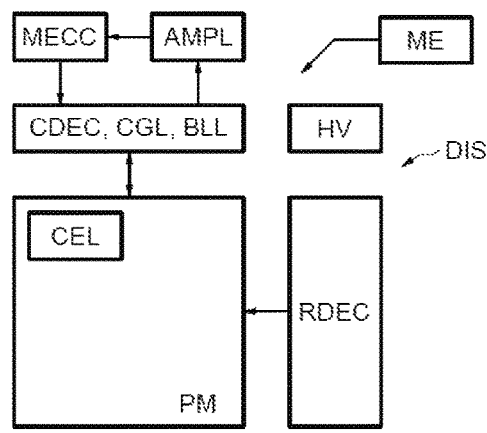
FIGS. 1 and 2 schematically show an EEPROM memory device.
Figure 2:
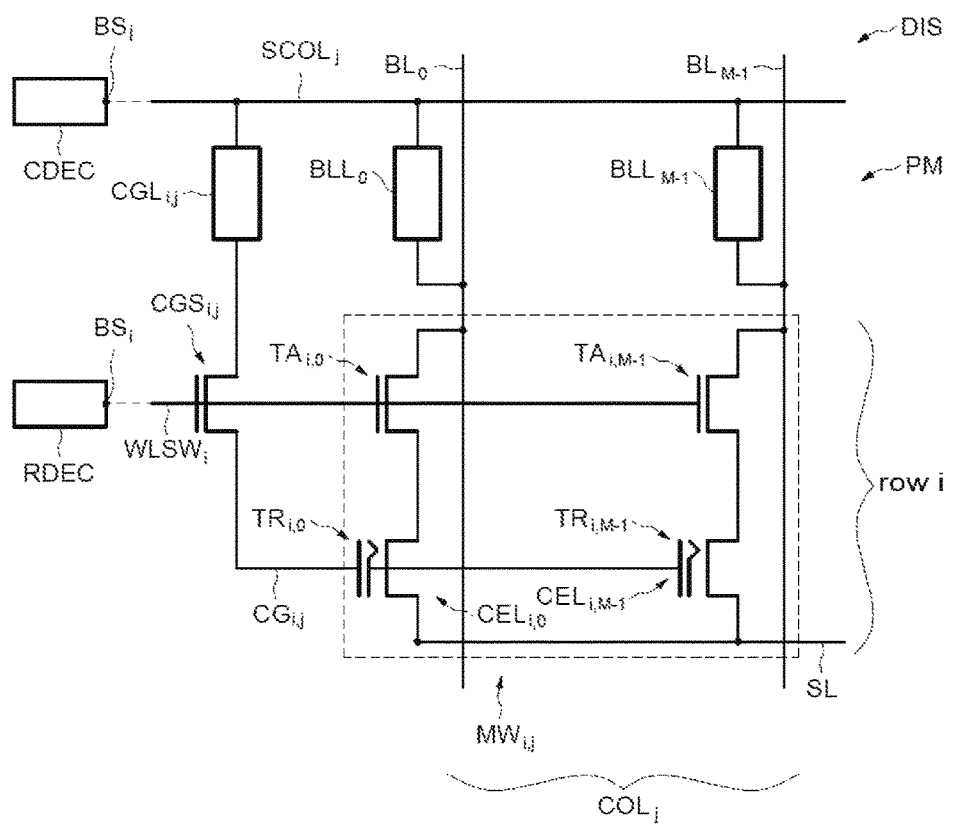

FIGS. 1 and 2 illustrate an EEPROM memory device comprising a memory plane PM containing memory cells CEL. As will discussed in detail below, the sense amplifier block AMPL can be configured on command between a current-sensing mode and a voltage-sensing mode.

The device DIS especially comprises a row decoder RDEC, a column decoder CDEC, row-select line latches CGL and bit-line latches BLL connected to the bit lines BL of the memory plane, these latches being supplied by a high-voltage supply HV.

A state machine ME controls the operations of the memory device DIS.

As illustrated in FIG. 2, the memory cells CEL are connected to row-select lines delivering signals $WLSW_i$, and to bit lines BL.

The bit lines are grouped in columns $COL_j$ here comprising M bit lines $BL_o$-$BL_{M-1}$.

M may for example be equal to 38, thus corresponding to words of 32 useful bits (4 bytes) accompanied by 6 check bits used in an error correction code (ECC) mechanism implemented in ECC circuitry MECC (FIG. 1).

The memory cells connected to a given select line form a word line and the memory cells (of a given word line) connected to M bit lines of a column $COL_j$ form a memory word $MW_{i,j}$ allowing M bits to be stored.

For the sake of simplicity, only a single word $MW_{i,j}$ belonging to one column $COL_j$ and to one row i is shown in FIG. 2.

Each memory cell $CEL_{i,j}$ comprises a floating-gate state transistor $TR_{i,j}$ and a MOS access transistor $TA_{i,j}$. The transistor $TA_{i,j}$ is controlled via its gate by the signal $WLSW_i$. Its drain is connected to the corresponding bit line BL and its source is connected to the drain of the floating-gate transistor $TR_{i,j}$.

A command element, here a MOS transistor, $CGS_{i,j}$ is here also controlled via its gate by the signal $WLSW_i$ and delivers a command signal $CG_{i,j}$ to the control gates of all the floating-gate transistors $TR_{i,j}$ of the column $COL_j$ (the memory word).

The signal $WLSW_i$ is delivered to the output terminal $BS_i$ of the row decoder RDEC.

The transistor $CGS_{i,j}$ is moreover connected to a column-select line $SCOL_j$ connected to the output $BS_j$ of the column decoder CDEC, by way of a column latch $CGL_j$.

Moreover, each bit line $BL_k$ of the column $COL_j$ is connected to the line $SCOL_j$ by way of a bit-line latch $BLL_k$.

Lastly, the sources of the floating-gate transistors TR of the cells are connected to a source line SL.

Sense amplifiers AMPL (FIG. 1) are configured to read the contents of the bits stored in the memory cells of the memory plane or indeed in certain cases in the bit-line latches.

Non-volatile memories, especially EEPROMs, are subject to data corruptions, due to faulty memory cells or memory locations, commonly designated single bit fails by those skilled in the art.

These faults may be present from the start in "new" memories or indeed be absent initially and then generated over time during the lifetime of the part.

These faults may for example be due to defects in the fabrication process, to oxide breakdown and/or to the appearance of retention losses in isolated memory cells.

Production of non-volatile memories of increasingly high densities, i.e., with larger and larger memory capacities, is currently being targeted, and, as a result of the increasing densities, the probability of an erroneous datum being stored has increased.

These faulty memory locations lead, when bits contained in these locations are read, to erroneous logic values.

A conventional solution uses an error correction code ECC to correct the erroneous logic value of a bit. More precisely, with an error correction code, if s check bits are added to b data bits it is possible to correct r errors in the b+s bits.

Generally, the error correction codes used in the field of memories allow a single error (r=1) to be corrected in the word of b+s bits. A plurality of memory errors may be corrected provided that the faulty locations correspond to bits not located in the same group of (b+s) bits.

More precisely, as is conventional and known, the ECC circuitry MECC implementing the error correction code make it possible, when a word is read from the memory, to determine a syndrome from the data bits b and the set of check bits s.

It will be recalled here that a syndrome is the result of intermediate calculations carried out during the error correction, allowing the error to be located and detected in order to correct it.

Conversely, the ECC circuitry MECC is also capable of calculating a set of check bits from a set of data bits.

In order to decrease the footprint of the ECC mechanisms, it is common for a plurality of data bytes to share a given ECC mechanism. For example 4 bytes of a word share the same 6 check bits, the entirety forming a 38-bit memory word.

As a result the physical granularity of the memory is several bytes (4 bytes in the preceding example) whereas the granularity accessible to the user of the memory is generally one byte.

In an EEPROM memory architecture equipped with an error correction code mechanism, each time it is desired to write, for example, a new byte in a memory word containing n bytes and s check bits, the current contents of the memory word, i.e. the 8n+s bits, namely the 38 bits of the memory word in the case of the preceding example, are read.

An error correction is optionally carried out by the error correction code circuitry MECC.

New check bits are recalculated from the new byte and n−1 other optionally corrected initial bytes.

Next, the new memory word is loaded into the bit-line latches BLL.

If another byte of the same memory word must also be modified, then the complete memory word just loaded into the bit-line latches is read, this time from the bit-line latches BLL, and the preceding operations are repeated.

Thus, during a write operation of a memory, it may be necessary to read data either from the memory plane or from bit-line latches.

There are two separate types of sense amplifiers, respectively operating in a current-sensing mode or voltage-sensing mode.

Generally, the current-sensing mode is used in all medium- and high-density EEPROM memories and is considered to be the most suitable mode.

Specifically, it especially allows memory architectures having neighboring data bits (case of what are called full-featured EEPROMs) to be effectively managed, thereby avoiding read access time problems caused by capacitive coupling of the bit lines of the memory plane.

However, the current-sensing mode is disadvantageous when a bit-line latch is to be read.

Specifically, a current-mode sense amplifier is especially configured to apply a set precharge voltage to its input.

Now, for example, when the datum stored in a bit-line latch is a "1", the latch asserts a constant zero voltage at its output.

Thus, such a sense amplifier connected to the output of such a bit-line latch attempts to assert a constant positive voltage on a grounded node. A very high resulting current is generated because of a very low resistivity.

This results in the appearance of periodic current peaks of about a few milliamps when a memory word is read from a bit-line latch, and therefore in excess power consumption.

These problems with excess consumption do not arise when a memory cell of the memory plane is read in a current-mode because the access path to such a cell in the enabled (programmed) state is much more resistive than the output of a bit-line latch.

The voltage-sensing mode allows the voltage present on the input of the sense amplifier to drop and thus makes it possible to decrease, or even prevent, the excess power consumption when a bit-line latch is read.

However, using an amplifier operating in a voltage-sensing mode to read memory cells of the memory plane causes read access time problems due to capacitive coupling of the bit lines.

According to one embodiment, it is proposed, when reading data, to mitigate the effects of parasitic capacitive coupling between bit lines and to avoid excess power consumption, in particular in the case of medium- and high-density memories.

Thus, according to one aspect, a memory sense amplifier is provided, in particular for a non-volatile memory, such as for example an EEPROM memory, which is configurable on command between a current-sensing mode configuration and a voltage-sensing mode configuration.

More precisely, according to one embodiment, the sense amplifier is able in its current-sensing configuration to deliver as output an information item representative of whether or not a current is flowing through the input, and able in its voltage-sensing configuration to deliver as output an information item representative of whether or not the voltage on this input has dropped.

This aspect allows sense amplifiers to be optimized especially in terms of read reliability, access time to a datum and power consumption.

Furthermore a space saving is obtained by producing a sense amplifier that is configurable on command, relative to producing two separate sense amplifiers configured respectively in one or other of the sensing modes.

In addition, especially when in accordance with the embodiments described below, this aspect has the advantage of being simple to produce and is compatible with the various bit-line latch technologies known in the art.

The sense amplifier is advantageously intended, in its current-sensing configuration, to read a datum stored in a memory cell connected to the amplifier, and advantageously intended, in its voltage-sensing configuration, to read a datum stored in a bit-line latch connected to the amplifier.

The read access time problems caused by the capacitive coupling of bit lines of the memory plane are decreased, or even avoided, by virtue of the application of a set precharge voltage, and excess current consumption is limited by the current injected into the input.

Moreover, the output data lines of the bit-line latches may generally be separated by larger distances than the bit lines of the memory plane and are generally shorter than the bit lines. This limits the capacitive coupling between the data lines.

According to one embodiment, the sense amplifier comprises a configurable input stage connected between the input and an intermediate node and able to deliver to the intermediate node an intermediate signal the voltage level of which is, depending on the configuration, representative of whether or not the current is flowing through the input (current-sensing configuration) or whether or not the voltage present on the input has dropped (voltage-sensing configuration), and an output stage configured to deliver the information item on the basis of the intermediate signal.

According to one embodiment, the input stage comprises a precharge loop configured to apply a precharge voltage to the input and a configurable controller connected between the precharge loop and the intermediate node, possessing a first configuration in which it allows maintenance of the precharge voltage on the input in the current-sensing configuration, and a second configuration in which it permits a possible drop in the voltage on the input in the voltage-sensing configuration.

The controller may include an n-type transistor the gate of which is connected to the intermediate node, the source of which is connected to the precharge loop, and having its drain connected to the drain of a p-type transistor controlled via its gate by a command signal defining the sensing configuration and having its source connected to a supply voltage Vdd.

This embodiment has the advantage of passing simply from one sensing mode to the other, depending on the command signal applied to a transistor of the amplifier, and the same elements of the sense amplifier are then exploited differently depending on whether the controller is in its first or second configuration.

According to one embodiment, the sense amplifier may be adapted to various bit-line-latch architectures, and its output stage may then be configured to translate the intermediate signal into a binary logic signal, and includes an inverter configured to invert the logic signal, in the voltage-sensing configuration.

In EEPROM memories, the logic value of a bit stored in a memory point is represented by the value of the threshold voltage of a floating-gate transistor, which value may be modified at will by programming or erasing operations. The programming or erasing of a floating-gate transistor consists in injecting or extracting electric charge into or from the gate of the transistor via a tunneling effect ("Fowler-Nordheim" effect) using a high voltage Vpp that may be about 10 to 20 volts, typically 13 volts.

This high voltage of 13 volts, required to write to EEPROM memories, is not reducible and is very constraining both as regards the technological approach employed and the reliability of the product.

Specifically, lithography size reduction, i.e., the decrease in etched feature size, has led to a decrease in operating voltages, and this high write voltage has become more problematic in terms especially of leakage from transistor source/drain junctions and in terms of breakdown of gate oxides.

Consequently, these risks of breakdown and premature transistor ageing have a direct impact on the reliability of the product.

One solution that has been envisioned is what is referred to by those skilled in the art as a split-voltage solution. More precisely, the high voltage Vpp required to program memory planes is split between a positive voltage Vpp+ and a negative voltage Vpp− so that the difference (Vpp+−Vpp−) is equal to Vpp. Thus, in such an approach, the voltage Vpp+ is set to about 5 volts and the voltage Vpp− to about −8 volts.

Such a solution allows the constraint on the voltage withstand of the transistors to be relaxed.

Figure 3:
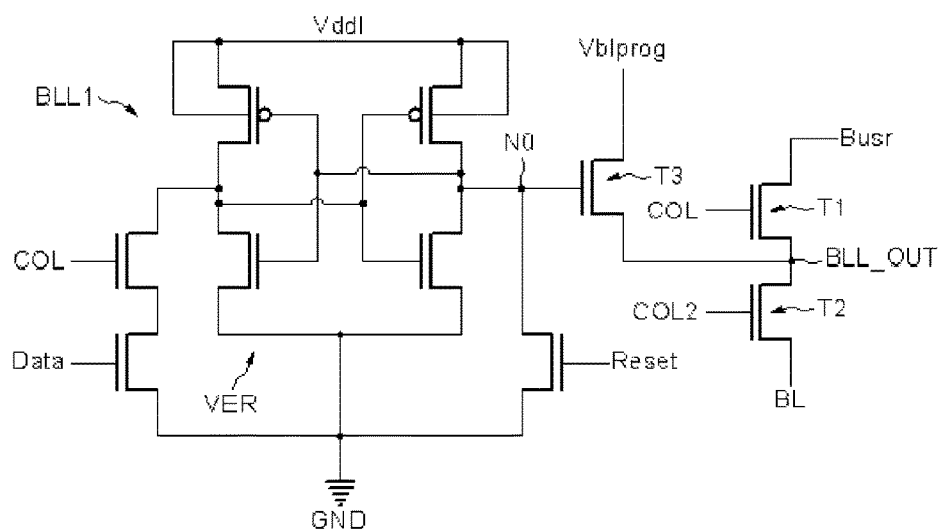
FIGS. 3 and 4 show two exemplary bit-line-latch architectures.
Figure 4:
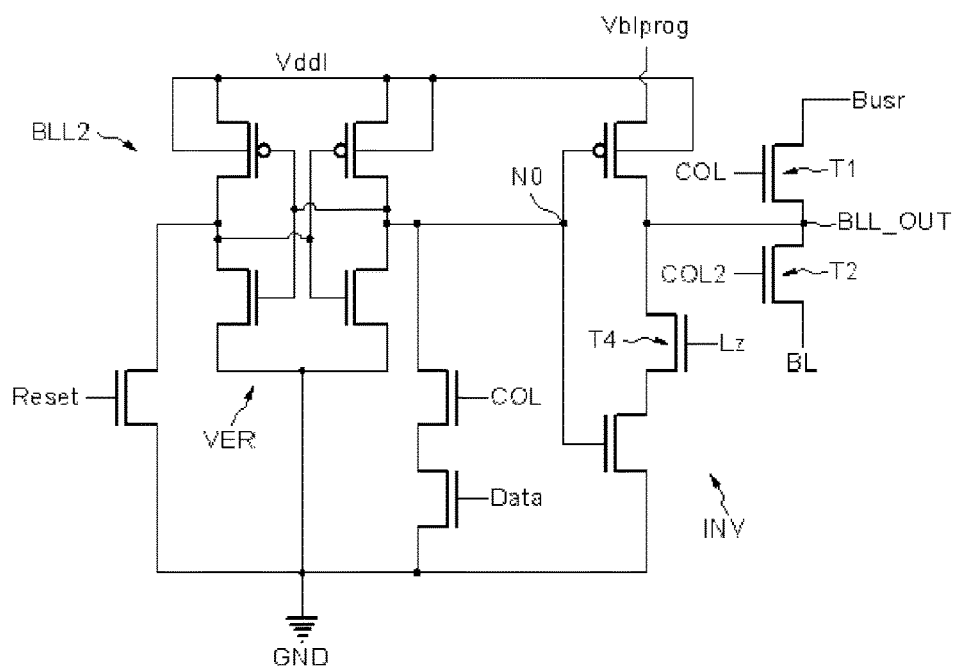

Depending on the adopted solution (split voltage or not), the architecture of a bit-line latch is different, as illustrated in FIGS. 3 and 4, which will now be described.

FIG. 3 shows an example of an architecture of a bit-line latch BLL1.

The bit-line latch BLL1 comprises an output BLL_OUT connected to the input Busr of a sense amplifier via an n-type transistor T1 controlled by a signal COL and to a bit line BL via an n-type transistor T2 controlled by a signal COL2.

Depending on the values of the signals COL and COL2, the input Busr of the sense amplifier will be effectively connected either to the bit-line latch in order to read the stored datum or to a selected memory cell connected to the bit line in order to read the contents of the memory cell.

The output BLL_OUT of the latch is coupled to a voltage Vblprog via an n-type transistor T3 controlled by the signal present on the output node No of a memory latch VER including two inverters that are cross-coupled and storing a datum.

The memory latch VER is set via signals Data and COL and reset by a signal Reset.

The voltage present on the output node No corresponds to the stored logic datum (high level Vdd if Data="1", low level GND if Data="0").

When a datum is loaded into the memory latch VER, the signal COL is at a high level Vdd, the signal COL2 is at a low level GND, and the signal Data is at a level corresponding to the value of the datum to be loaded. The level of the voltage Vblprog is irrelevant in this situation.

When a datum stored in the bit-line latch BLL1 is read, the signal COL is at a high level Vdd, the signal COL2 is at a low level GND, the voltage Vblprog is at GND, and the signal Data is forced to "0" in order not to reposition the memory latch VER.

Thus, the voltage present on the output BLL_OUT coupled to the input Busr of the sense amplifier is GND (Vblprog) if the latch contains the datum "1", and is floating if the latch contains the datum "0".

When a datum stored in the memory cell connected to the bit line BL is read, the signals COL and COL2 are at a high level Vdd and Busr is therefore still connected to the output BLL_OUT.

The memory latch VER is reset (Reset="1") in order to obtain a floating voltage on the output BLL_OUT (output BLL_OUT of high impedance). The signal Data is forced to "0" in order not to reposition the memory latch VER and the level of the voltage Vblprog is irrelevant in this situation.

Thus, the voltage present on the bit line BL coupled to the input Busr is pulled to GND if the cell contains the datum "1" and is floating if the cell contains the datum "0".

FIG. 4 shows an example of an architecture of a bit-line latch BLL2 that is in particular very suitable for a split-voltage solution.

Elements that are analogous or functionally analogous to those in FIG. 3 have been given identical references.

The bit-line latch BLL2 comprises the output BLL_OUT connected to the input Busr of a sense amplifier via the n-type transistor T1 controlled by the signal COL and to the bit line BL via the n-type transistor T2 controlled by the signal COL2.

Depending on the values of the signals COL and COL2, the input Busr of the sense amplifier will be effectively connected either to the bit-line latch in order to read the stored datum or to a selected memory cell connected to the bit line in order to read the contents of the memory cell.

The output BLL_OUT of the latch is connected to the output of an inverter INV the input of which is the signal present on the output node No of the memory latch.

The memory latch VER is set via signals Data and COL and reset by the signal Reset.

The voltage present on the output node No of the memory latch VER corresponds to the inverse of the loaded logic datum (low level GND if Data="1", high level Vdd if Data="0").

The inverter INV delivers the voltage Vblprog if the voltage present on the node No is at a low level GND, and a low level GND if this voltage is at a high level Vdd and if a signal Lz is at a high level (the signal Lz controls an n-type transistor T4 placed between the output BLL_OUT of the inverter and ground).

If the voltage present on the node No is at a high level and the signal Lz is at a low level, the voltage of the output BLL_OUT of the bit-line latch BLL2 is floating.

When a datum is loaded into the memory latch VER, the signal COL is at a high level Vdd, the signal COL2 is at a low level GND, and the signal Data is at a level corresponding to the value of the datum to be loaded. The level of the voltage Vblprog and of the signal Lz are irrelevant in this situation.

When a datum stored in the bit-line latch BLL2 is read, the signal COL is at a high level Vdd, the signal COL2 is at a low level GND, and the voltage Vblprog is at a high level Vdd. The signal Lz is at a high level Vdd, and the level of the signal Data is irrelevant in this situation.

Thus, the voltage present on the output BLL_OUT coupled to the input Busr of the sense amplifier is the voltage Vdd (Vblprog) if the latch has been loaded with the datum "1", and is ground GND if the latch has been loaded with the datum "0".

A datum stored in a memory cell is read identically to the situation described above in relation to FIG. 3, the memory latch VER is reset (Reset="1") and in addition Lz is at a low level GND in order to leave the voltage of the output BLL_OUT floating (output BLL_OUT of high impedance).

The latch BLL2 shown in FIG. 4 is however more suitable than the latch BLL1 shown in FIG. 3 to a split-voltage type architecture for the following reason:

During a programming operation, the voltage difference between two bit lines, one connected to a cell to be programmed, the other connected to a cell not to be programmed, must typically be at least 5 V.

In the case of a conventional memory architecture (i.e., an architecture without voltage splitting), the voltage applied to a selected bit line is typically 13 V.

In the case of a split-voltage architecture, the voltage applied to a selected bit line is typically 5 V.

Whatever the architecture, capacitive coupling between a bit line left floating and its two near neighbours may reach 50%.

In the case of the latch BLL1 shown in FIG. 3, a bit line not selected in programming is left floating. If its two nearest-neighbour bit lines are selected in programming, they are raised to 13 V, and the bit line not selected will rise by coupling to 6.5 V.

The voltage difference between the not-selected bit line and the selected bit lines will therefore be 13−6.5=6.5 V, which is higher than 5 V and therefore enough to differentiate in programming a selected bit line from a not-selected bit line.

If the latch BLL1 shown in FIG. 3 were used in the context of a split-voltage type architecture, the selected bits lines would rise to 5 V, the not-selected bit line to 2.5 V and the voltage difference between the lines would be only 2.5 V, which would not be enough to differentiate in programming a selected bit line from a not-selected bit line.

The latch BLL2 shown in FIG. 4 forces a bit line that is not selected in programming to the low level, instead of leaving it floating as the latch BLL1 does. It therefore prevents the capacitive-coupling-induced parasitic rise in the voltage of a bit line not selected in programming. It is therefore compatible with an activation schema in which the voltage of a bit line selected in programming could be as low as 5 V.

Figure 5:
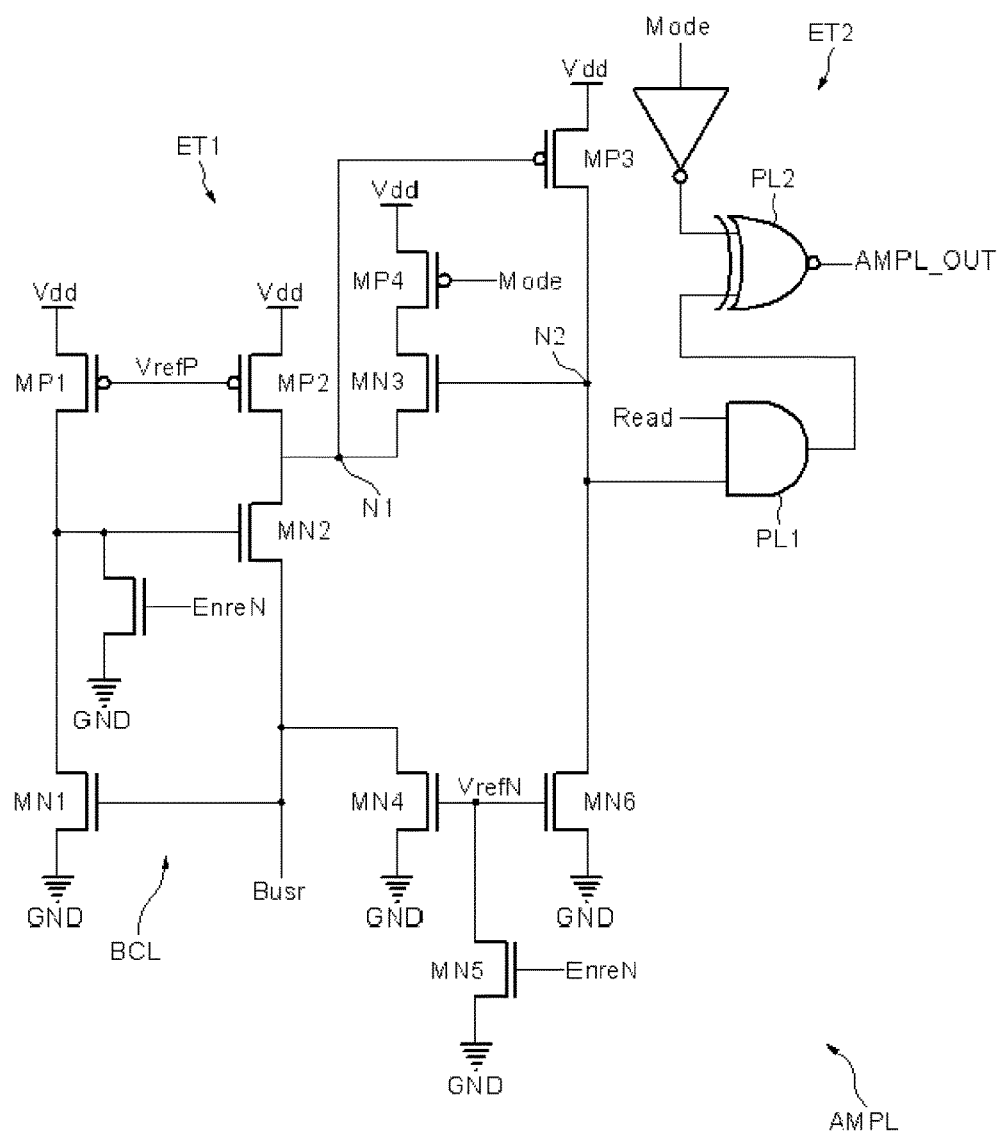
FIG. 5 shows one embodiment of a sense amplifier according to one embodiment of the invention.

FIG. 5 shows a sense amplifier AMPL according to one embodiment of the invention.

The sense amplifier AMPL is configurable in response to a command signal Mode between a current-sensing mode configuration (for example Mode="0") and a voltage-sensing mode configuration (for example Mode="1").

In the voltage-sensing mode, the sense amplifier AMPL is especially able to read a datum stored in a bit-line latch BLL2 of the type shown in FIG. 4.

Various details of the amplifier AMPL according to this embodiment and described in greater detail below are given by way of non-limiting example.

The sense amplifier AMPL comprises an input stage ET1 configured to apply a precharge voltage to the input Busr of the sense amplifier before this input is effectively connected either to the output of a bit-line latch or to a bit line. The input stage ET1 includes a precharge loop BCL comprising two n-type transistors MN1 and MN2 and two current sources MP1 and MP2.

In this example, the current sources MP1, MP2 each include a p-type transistor the source of which is connected to the supply voltage Vdd, the transistor being controlled, via its gate, by a voltage VrefP close to the threshold voltage of the transistor, but higher in absolute value.

The gate of the transistor MN1 is connected to the input Busr of the sense amplifier, its source is connected to ground and its drain is connected to the current source MP1.

The gate of the transistor MN2 is connected to the drain of the transistor MN1, the drain (node N1) of the transistor MN2 is connected to the current source MP2, and the source of the transistor MN2 is connected to the input node Busr and to the gate of the transistor MN1.

Thus, this loop BCL allows a constant precharge voltage equal to the threshold voltage of the transistor MN1 to be applied to the input Busr of the sense amplifier.

In this example, the amplifier AMPL also includes two p-type transistors MP3 and MP4, and an n-type transistor MN3.

The gate of the transistor MP3 is connected to the node N1, its source to the supply voltage Vdd, and its drain to an intermediate node N2 that is the output node of the stage ET1.

The gate of the transistor MN3 is connected to the node N2, its source to the node N1 and its drain to the supply voltage Vdd via the transistor MP4 controlled, via its gate, by the command signal Mode.

The amplifier AMPL also includes an output stage ET2 configured to translate an intermediate signal, i.e., the voltage present on the intermediate node N2, into a binary logic signal.

The output stage ET2 here includes an AND gate PL1 one input of which is connected to the node N2 and another input of which receives a signal Read.

The output of the AND gate PL1 is connected to an input of an EXCLUSIVE NOR (XNOR) gate PL2, and another input of the XNOR gate PL2 receives the inverse of the command signal Mode. The output of the XNOR gate PL2 forms the output AMPL_OUT of the sense amplifier AMPL.

A signal EnreN ("enable read") makes it possible to activate (EnreN="0") the amplifier or not to activate it (EnreN="1"). When it is set to "0", this signal allows two current sources MN4 and MN6 to be activated. In this example, the current sources MN4 and MN6 each include an n-type transistor the source of which is connected to ground GND, each of the transistors being controlled via its gate by a voltage VrefN close to the threshold voltage of the transistor, but higher in absolute value.

The current injected by MN4 pulls the voltage of the input Busr to ground via a small biasing current, allowing the precharge voltage to be stabilized. The current of the source MN4 is very much smaller than the current of the source MP2.

The current injected by MN6 pulls the voltage present on the node N2 to ground GND, when the transistor MP3 is turned off.

Together the transistors MP3 and MN6 form an inverter the input of which is the node N1 and the output the node N2.

If the signal EnreN is set to "1", the loop BCL is "short-circuited" and the transistors MN4 and MN6 are turned off.

The state machine ME (FIG. 1) is especially configured to generate the signals Read, EnreN and Mode depending on the implementation of the device DIS.

When the sense amplifier AMPL reads a datum, Read is "1".

It will now be assumed that the command signal Mode is "0", thereby corresponding to a current-sensing mode used to read a memory cell of the memory plane.

If the datum stored in the memory cell is "1", the cell is enabled and draws a current larger than the current generated by MP2, this current flowing through the input Busr.

The flow of current through the input Busr causes the voltage on the input Busr to drop, the transistor MN1 of the loop BCL is turned off, the current generated by the current source MP1 turns the transistor MN2 on and as the current that is flowing through the input Busr is larger than the current generated by the source MP2, the voltage present on the node N1 also drops.

The transistor MP3 turns on and transmits a high voltage to the node N2, causing the transistor MN3 to turn on.

Since the transistor MP4 is turned on (Mode="0"), the turned-on transistor MN3 prevents the voltage on the node Busr from dropping below the precharge voltage because of a current flow larger than that generated by MP2.

Specifically, in this configuration the current able to flow through the input Busr is not limited by the source MP2, but by the impedance of the element (here the bit line) connected to the input Busr when it is precharged to the precharge voltage.

The output of the AND gate PL1 passes to a high level (N2=high voltage; Read="1"), this level is transmitted without being inverted by the XNOR gate PL2 (Mode="0"), and the output AMPL_OUT of the sense amplifier delivers a "1" logic signal, corresponding to the stored datum.

If the datum stored in the memory cell is "0", the voltage of the bit line BL connected to the input Busr is floating and reaches equilibrium at the precharge voltage and the transistor MP3 remains turned off. No current flows through the input Busr.

The current source MP2 maintains the voltage present on the node N1 at a high level in the absence of current on the input Busr.

The transistor MP3 is turned off and the voltage present on the node N2 is at a low level under the effect of a flow of current to ground through the transistor MN6.

The output of the AND gate PL1 passes to a low level, this level is transmitted without being inverted by the XNOR gate PL2 (Mode="0"), and the output AMPL_OUT of the sense amplifier delivers a "0" logic signal, corresponding to the stored datum.

It will now be assumed that the command signal Mode is "1", corresponding to a voltage-sensing mode used to read a datum from a bit-line latch BLL2.

If the datum loaded into the bit-line latch is "1", the voltage present on the output BLL_OUT of the latch is at a high level Vdd and the voltage of the input Busr of the amplifier is then forced to this high level.

The transistor MN1 of the loop BCL turns on and the current generated by the current source MP1 flows to ground GND, turning off the transistor MN2.

The current source MP2 maintains the voltage present on the node N1 at a high level and the transistor MP3 remains turned off.

As the transistor MP3 is turned off, the node N2 is at a low level under the effect of a flow of current to ground through the transistor MN6.

The output of the AND gate PL1 passes to a low level, this level is inverted by the XNOR gate PL2 (Mode="1"), and the output AMPL_OUT of the sense amplifier delivers a "1" logic signal, corresponding to the stored datum.

If the data loaded into the bit-line latch is "0", the voltage present on the output BLL_OUT of the latch is at a low level GND and the voltage of the input Busr of the amplifier is forced to drop.

The transistor MN1 of the loop BCL is turned off, the current generated by the current source MP1 turns the transistor MN2 on and the voltage present on the node N1 also experiences the voltage drop.

The transistor MP3 turns on and a high voltage is transmitted to the node N2.

Since MP4 is turned off (Mode="1"), the transistor MN3 cannot transmit a high voltage to the node N1. The sense amplifier AMPL therefore does not compensate for the drop in the voltage on the input Busr and, in this situation, the current able to flow through the input Busr is limited and controlled by the current source MP2.

As a high voltage is transmitted to the node N2, the output of the AND gate PL1 passes to a high level, this level is inverted by the XNOR gate PL2 (Mode="1"), and the output AMPL_OUT of the sense amplifier delivers a "0" logic signal, corresponding to the datum stored The embodiment in FIG. 5 may be modified so as to obtain a sense amplifier capable of operating with a bit-line latch of the type shown in FIG. 3. More precisely, this modification is here reflected in a modification of the output stage ET2, namely removal of the XNOR gate PL2.

The output AMPL_OUT of the sense amplifier is then formed by the output of the AND gate PL1.

Moreover, the invention is not limited to the embodiment described above but encompasses any variant thereof. For example, the output stage could comprise a differential amplifier, and the precharge voltage could be formed and maintained by other means.

Although embodiments of the invention suitable for EEPROM memories were described, it will be clear to a person skilled in the art that the invention is not limited to this type of memory and may especially be applied to flash memories including sense amplifiers confronted with similar problems, or even to static RAM memories.

What is claimed is:

1. A sense amplifier comprising:
   an output terminal;
   an input terminal;
   an input stage connected to the input terminal;
   an output stage connected to the output terminal;
   a first transistor having a current path coupled to a first supply terminal and having a control terminal coupled to an output of the input stage;
   a second transistor coupled to the first supply terminal;
   a mode input terminal coupled to a control node of the second transistor;
   a third transistor coupled to the second transistor and having a control terminal coupled to the current path of the first transistor;
   a fourth transistor coupled between the input terminal and a second supply terminal; and
   a fifth transistor coupled between the first transistor and the second supply terminal, the fifth transistor having a control terminal coupled to a control terminal of the fourth transistor.

2. The sense amplifier of claim 1, wherein the input stage comprises:
   a first current source coupled to the first supply terminal;
   a second current source coupled between the first supply terminal and the output of the input stage;
   a sixth transistor coupled between the input terminal of the sense amplifier and the output of the input stage; and
   a seventh transistor coupled between a control terminal of the sixth transistor and the second supply terminal.

3. The sense amplifier of claim 2, further comprising:
   an eighth transistor coupled between the control terminal of the fifth transistor and the second supply terminal; and
   an enable input terminal coupled to a control terminal of the eighth transistor, wherein the input stage further comprises a ninth transistor coupled between the control terminal of the sixth transistor and the second supply terminal, the ninth transistor having a control terminal coupled to the enable input terminal.

4. The sense amplifier of claim 3, wherein:
   the first transistor is a p-type transistor;
   the second transistor is a p-type transistor;
   the third transistor is an n-type transistor;
   the fourth transistor is an n-type transistor;
   the fifth transistor is an n-type transistor;
   the sixth transistor is an n-type transistor;
   the seventh transistor is an n-type transistor;
   the eighth transistor is an n-type transistor; and
   the ninth transistor is an n-type transistor.

5. The sense amplifier of claim 1, wherein the output stage comprises:
   an AND gate having a first input coupled to the first transistor;
   an XNOR gate having a first input coupled to an output of the AND gate and an output coupled to the output terminal; and
   a first inverter having an input coupled to the mode input terminal and an output coupled to a second input of the XNOR gate.

6. The sense amplifier of claim 1, wherein
   the mode input terminal is configured to receive a signal in a first state or in a second state;
   the input stage is configured to supply a first current to the input terminal when the signal is on the first state; and
   the input stage is configured to supply a second current to the input terminal when the signal is on the second state, the first current being higher than the second current.

7. The sense amplifier of claim 6, wherein the first state corresponds to a low voltage and the second state corresponds to a high voltage.

8. A memory device comprising:
   a memory cell coupled to a bit line;
   a bit-line latch; and
   a sense amplifier comprising
      an output terminal,
      an input terminal coupled to an output of the bit-line latch via a first transistor, the output of the bit-line latch coupled to the memory cell via a second transistor,
      an input stage connected to the input terminal,
      an output stage connected to the output terminal,
      a third transistor having a current path coupled to a first supply terminal and having a control terminal coupled to an output of the input stage,
      a fourth transistor coupled to the first supply terminal,
      a mode input terminal coupled to a control node of the fourth transistor,
      a fifth transistor coupled to the fourth transistor and having a control terminal coupled to the current path of the third transistor.

9. The memory device of claim 8, wherein the memory cell comprises a floating transistor.

10. The memory device of claim 8, wherein the input stage comprises a precharge loop comprising:

a first current source coupled to the first supply terminal;
a second current source coupled between the first supply terminal and the output of the input stage;
a sixth transistor coupled between the input terminal of the sense amplifier and the output of the input stage; and
a seventh transistor coupled between a control terminal of the sixth transistor and a second supply terminal.

11. The memory device of claim 10, wherein the precharge loop is configured to apply a precharge voltage to the input terminal of the sense amplifier before turning on the first transistor.

12. The memory device of claim 10, wherein the first supply terminal is configured to receive a positive voltage and the second supply terminal is configured to receive a ground reference.

13. The memory device of claim 10, wherein:
the first current source comprises a p-type transistor;
the second current source comprises a p-type transistor having a control terminal coupled to a control terminal of the p-type transistor of the first current source; and
the control terminal of the p-type transistor of the second current source is configured to receive a first reference voltage.

14. The memory device of claim 10, wherein
the mode input terminal is configured to receive a signal in a first state or in a second state;
the precharge loop is configured to supply a first current to the input terminal of the sense amplifier when the signal is on the first state; and
the precharge loop is configured to supply a second current to the input terminal of the sense amplifier when the signal is on the second state, the first current being higher than the second current.

15. The memory device of claim 14, wherein the first state corresponds to a low voltage and the second state corresponds to a high voltage.

16. The memory device of claim 8, wherein the output stage comprises:
an AND gate having a first input coupled to the third transistor;
an XNOR gate having a first input coupled to an output of the AND gate and an output coupled to the output terminal; and
a first inverter having an input coupled to the mode input terminal and an output coupled to a second input of the XNOR gate.

17. The memory device of claim 8, further comprising:
an eighth transistor coupled between the input terminal of the sense amplifier and a second supply terminal; and
a ninth transistor coupled between the third transistor and the second supply terminal, the ninth transistor having a control terminal coupled to a control terminal of the eighth transistor.

18. The memory device of claim 17, wherein:
the first transistor is an n-type transistor;
the second transistor is an n-type transistor;
the third transistor is a p-type transistor;
the fourth transistor is a p-type transistor;
the fifth transistor is an n-type transistor;
the eighth transistor is an n-type transistor; and
the ninth transistor is an n-type transistor.

19. The memory device of claim 8, wherein the bit-line latch comprises:
a memory latch comprising
a second inverter having an input and an output, and
a third inverter having an input coupled to the output of the second inverter and an output coupled to the input of the second inverter;
a tenth transistor coupled between a first voltage node and the output of the bit-line latch and having a control terminal coupled to the output of the second inverter; and
an eleventh transistor coupled between the control terminal of the tenth transistor and a second supply terminal.

20. The memory device of claim 19, wherein the bit-line latch further comprises:
a twelfth transistor coupled between the tenth transistor and the second supply terminal and having a control terminal coupled to the control terminal of the tenth transistor; and
a thirteenth transistor coupled between the output of the bit-line latch and the twelfth transistor.

21. The memory device of claim 8, wherein the memory device is configured to operate with split-voltage techniques.

22. A method comprising:
at a first time, reading a memory cell coupled to a bit line with a sense amplifier comprising
an output terminal,
an input terminal coupled to an output of a bit-line latch via a first transistor, the output of the bit-line latch coupled to a memory cell via a second transistor,
an input stage connected to the input terminal,
an output stage connected to the output terminal,
a third transistor having a current path coupled to a first supply terminal and having a control terminal coupled to an output of the input stage,
a fourth transistor coupled to the first supply terminal,
a mode input terminal coupled to a control node of the fourth transistor,
a fifth transistor coupled to the fourth transistor and having a control terminal coupled to the current path of the third transistor, wherein reading the memory cell comprises
receiving a signal at the mode input terminal, the signal having a first state,
turning on the first transistor, and
turning on the second transistor; and
at a second time, reading the bit-line latch by:
receiving the signal at the mode input terminal, the signal having a second state,
turning on the first transistor, and
turning off the second transistor.

23. The method of claim 22, wherein
the first state corresponds to a low voltage,
the second state corresponds to a high voltage.

24. The method of claim 22, further comprising:
supplying a first current to the input terminal of the sense amplifier when the signal is on the first state; and
supplying a second current to the input terminal of the sense amplifier when the signal is on the second state, the first current being higher than the second current.

* * * * *